(12) United States Patent
Doddi et al.

(10) Patent No.: US 8,358,828 B2
(45) Date of Patent: Jan. 22, 2013

(54) INTERPOLATION OF IRREGULAR DATA IN A FINITE-DIMENSIONAL METRIC SPACE IN LITHOGRAPHIC SIMULATION

(75) Inventors: Srini Doddi, Fremont, CA (US); Junjiang Lei, Bellevue, WA (US); Kuang-Hao Lay, Mountain View, CA (US); Weiping Fang, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 1062 days.

(21) Appl. No.: 11/966,920

(22) Filed: Dec. 28, 2007

(65) Prior Publication Data

US 2009/0169114 A1 Jul. 2, 2009

(51) Int. Cl.
*G06K 9/00* (2006.01)
(52) U.S. Cl. ....................................................... 382/141
(58) Field of Classification Search .......... 382/141–152, 382/181–231, 305, 306
See application file for complete search history.

(56) References Cited

U.S. PATENT DOCUMENTS

| | | | |
|---|---|---|---|
| 5,717,781 A * | 2/1998 | Ebel et al. | ...................... 382/141 |
| 5,815,685 A | 9/1998 | Kamon | |
| 5,893,095 A * | 4/1999 | Jain et al. | .............................. 1/1 |
| 6,187,483 B1 | 2/2001 | Capodieci et al. | |
| 6,453,274 B2 | 9/2002 | Kamon | |
| 6,883,158 B1 | 4/2005 | Sandstrom et al. | |
| 7,079,223 B2 | 7/2006 | Rosenbluth et al. | |
| 7,342,646 B2 | 3/2008 | Shi et al. | |
| 7,386,162 B1 | 6/2008 | Dakshina-Murthy et al. | |
| 7,403,265 B2 | 7/2008 | Tinnemans et al. | |
| 7,444,616 B2 | 10/2008 | Sandstrom et al. | |
| 7,512,927 B2 | 3/2009 | Gallatin et al. | |
| 7,530,048 B2 | 5/2009 | Joshi | |
| 7,566,517 B1 | 7/2009 | Adel et al. | |
| 7,631,289 B1 | 12/2009 | Lei | |
| 7,646,906 B2 | 1/2010 | Saidin et al. | |
| 7,689,966 B2 | 3/2010 | Verma et al. | |
| 7,695,876 B2 | 4/2010 | Ye et al. | |
| 7,739,651 B2 | 6/2010 | Melvin et al. | |
| 7,904,853 B1 | 3/2011 | Lei et al. | |

(Continued)

OTHER PUBLICATIONS

Genarri, Frank E. et al., "A Pattern Matching System tor Linking TCAD and EDA." Proceedings of the 5th International Symposium on Quality electronic Design, pp. 165-170, 2004.

(Continued)

*Primary Examiner* — Alex Liew
(74) *Attorney, Agent, or Firm* — Vista IP Law Group, LLP

(57) ABSTRACT

A method, system, and computer program product for pre-processing a pattern in a library of patterns and querying a preprocessed library of patterns are disclosed. Embodiments for querying a preprocessed library of patterns are disclosed for determining a distance between the representation for the first pattern and the representation for the second pattern, determining whether the distance between the representation for the first pattern and the representation for the second pattern is within the range for the first pattern, and transforming the second pattern with the transformation matrix to provide information about the second pattern. Embodiments for preprocessing a pattern in a library of patterns are disclosed for determining a transformation matrix for the first pattern, determining a range for the first pattern, wherein a distance between a representation for a first pattern and a representation for a second pattern is within the range and the second pattern can be transformed with the transformation matrix to provide information about the second pattern, and associating the range and the transformation matrix with the first pattern.

26 Claims, 8 Drawing Sheets

U.S. PATENT DOCUMENTS

| | | |
|---|---|---|
| 7,966,586 B2 | 6/2011 | Lei et al. |
| 8,079,005 B2 | 12/2011 | Lai et al. |
| 2002/0188917 A1* | 12/2002 | Yokoyama et al. ............... 716/4 |
| 2003/0044047 A1* | 3/2003 | Kelly et al. ................... 382/104 |
| 2004/0003357 A1 | 1/2004 | Palusinski et al. |
| 2004/0086197 A1 | 5/2004 | Fletcher et al. |
| 2005/0091631 A1 | 4/2005 | Gallatin et al. |
| 2005/0251771 A1 | 11/2005 | Robles |
| 2006/0203233 A1* | 9/2006 | Yu ............................... 356/237.2 |
| 2006/0228041 A1 | 10/2006 | Joshi |
| 2006/0277520 A1 | 12/2006 | Gennari |
| 2006/0282814 A1 | 12/2006 | Percin et al. |
| 2007/0032896 A1 | 2/2007 | Ye et al. |
| 2007/0234246 A1 | 10/2007 | Sinha et al. |
| 2008/0127027 A1 | 5/2008 | Gallatin et al. |

OTHER PUBLICATIONS

Roseboom, E. et al., "Automated Full-Chip Hotspot Detection and Removal Flow for Interconnect Layers of Cell-Based Designs." SPIE 2007, 9 pages.

Ma, M. et al., "Automatic hotspot classification using pattern-based clustering," Proc. SPIE 6925, 692505, Feb. 28, 2008.

\* cited by examiner

INTERPOLATION OF IRREGULAR DATA IN A FINITE-DIMENSIONAL METRIC SPACE IN LITHOGRAPHIC SIMULATION

FIELD

The present invention relates to the design of integrated circuits.

BACKGROUND

In an Integrated Circuit (IC) design, electronic components and wiring are represented by a set of geometric shapes and patterns from a physical perspective. A pattern is a set of polygon features in an area of an IC design. Electronic design automation (EDA) tools interact with these shapes and patterns throughout the IC design and verification process. Many physical design EDA applications require the identification of critical points in the design or hot spots to resolve issues with the design prior to printing the pattern. A hot spot may be an issue with the layout configuration of an IC design, usability of an IC design or manufacturability of an IC design.

One solution for detecting hot spots is with the use of simulation, simulating the actual lithography process on the design data to predict the eventual behavior of the printed pattern on a silicon wafer. But detecting hot spots with real time lithography simulations is often costly and time-consuming. It is highly desirable to limit the number of simulations that must be performed in the design process.

Patterns and shapes previously verified by lithography simulations can be stored in a database with a corresponding lithoscore, a score that indicates a severity rating for a hot spot the pattern or portion of a pattern in a layout, for the future use with EDA tools. When an EDA tool encounters a pattern, it may search a pattern database for a pattern match to retrieve the corresponding lithoscore for a similar pattern instead of conducting expensive lithography simulations. If the search result turns out to be positive, then no simulation will be needed for this pattern. Pattern analysis and matching play an important role in this approach.

Pattern matching is the matching of polygons and their vertices between two patterns. The problem with the pattern library and pattern matching approach is that accurate hot spot detection requires generating millions of geometric patterns to be able to identify every conceivable set of shapes or patterns both with and without hot spots. A library containing every possible pattern is both prohibitively time-consuming to build and store, and a large library is inefficient to use if a large number of comparisons with the patterns are necessary to find a matching pattern. Furthermore, a pattern may have a similar hot spot to a pattern in the library but may not be identified in a comparison with a similar pattern in the library because the two patterns are not identical. Thus, there is a need to build smaller library with enough information to speed up the search time and increase the accuracy in comparing patterns.

SUMMARY OF THE INVENTION

A method, system, and computer program product for querying a preprocessed library of patterns are disclosed. Embodiments for querying a preprocessed library of patterns are disclosed for associating a range with a first pattern, determining a representation for the first pattern, determining a representation for a second pattern, determining a distance between the representation for the first pattern and the representation for the second pattern, determining whether the distance between the representation for the first pattern and the representation for the second pattern is within the range for the first pattern, and transforming the second pattern with the transformation matrix to provide information about the second pattern.

A method, system, and computer program product for preprocessing a pattern in a library of pattern are disclosed. Embodiments for preprocessing a pattern in a library of patterns are disclosed for determining a representation for a first pattern, determining a transformation matrix for the first pattern, determining a range for the first pattern, wherein a distance between a representation for a first pattern and a representation for a second pattern is within the range and the second pattern can be transformed with the transformation matrix to provide information about the second pattern, and associating the range and the transformation matrix with the first pattern.

BRIEF DESCRIPTION OF THE DRAWINGS

The invention is illustrated by way of example and not limitation in the figures of the accompanying drawings, in which like references indicate similar elements and in which.

DETAILED DESCRIPTION

Figure 1A:
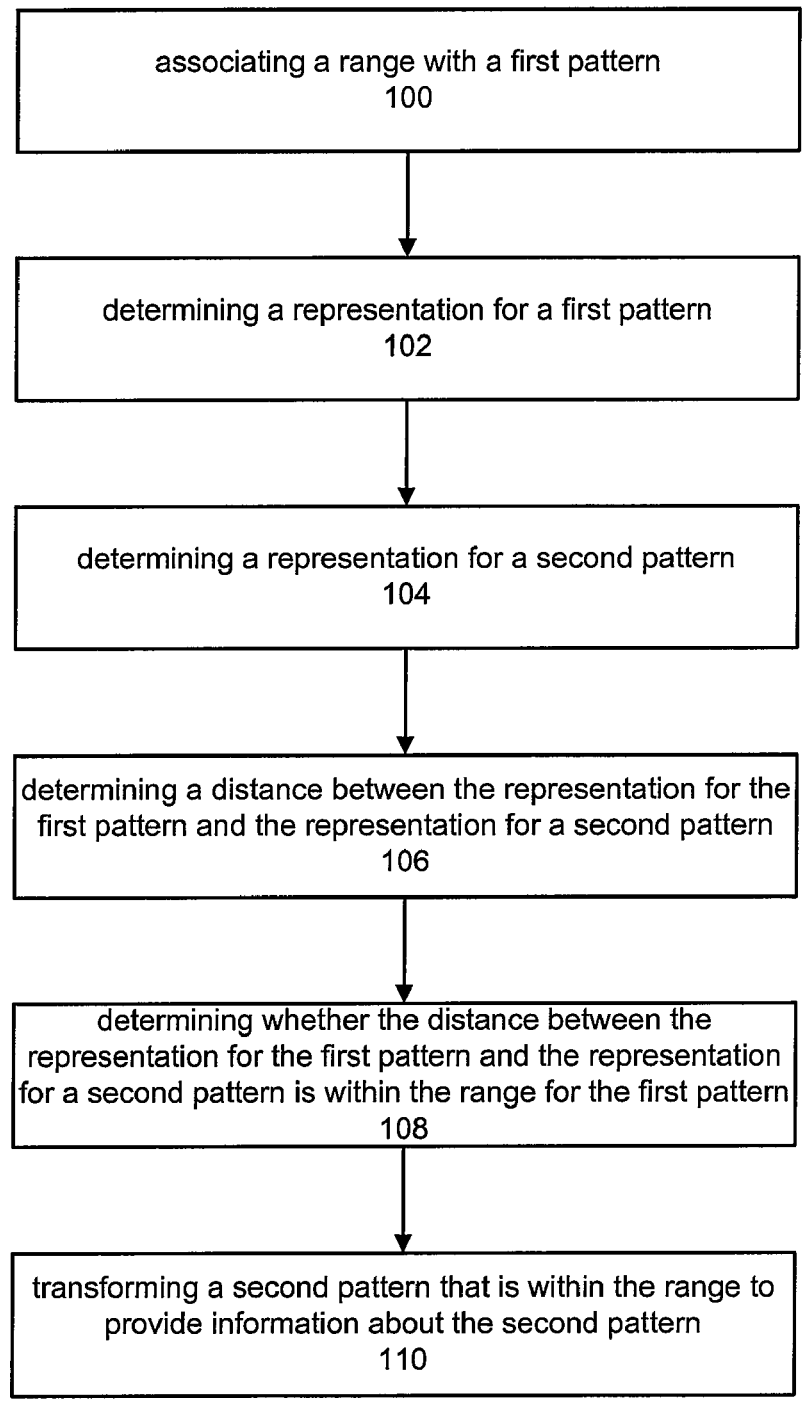
FIG. 1A is a flowchart for querying a preprocessed pattern library.

The present invention is directed toward providing methods, systems, and mediums for reducing pattern libraries and identifying patterns.

Embodiments of the present invention preprocess patterns in a pattern library in order to reduce the size of the pattern library, and yet maintain sufficient information in the reduced library for the identification or matching of similar patterns. To reduce the number of patterns in the library, each pattern in the library may be associated with information that permits the pattern to match or identify a larger set of patterns. In one or more embodiments, a pattern may be associated with a transformation matrix, a matrix to enable transformation of a given pattern representation into a score, and a validity range, a radius from a point or set of points from a pattern representation that will provide a sufficiently accurate prediction of scores for a given pattern.

A pattern may be associated with a pattern representation or pattern signature for the pattern that is a vector of numbers. A number in a vector may be referred to as a point and will be used interchangeably throughout the Specification. A range may be a vector of numbers or points that are used to determine whether a distance or difference between two or more patterns or pattern representations is close enough for computing a score for a given pattern. A score for a pattern may indicate specific information about the pattern, such as indicating the severity or the friendliness of a particular spot in a layout to the lithography process. The score may be measured with one or more metrics. A metric is a function which defines a distance between two points. For example, one could use any combination of the following metrics to compute a score: Exposure Latitude, Normalized Image Log-Slope, Mask Error Enhancement Factor, Depth of Focus, Edge Placement Error, and Image Contrast.

In one or more embodiments, patterns may be identified as having a hot spot with the pattern lithoscore, a score that indicates a severity rating for a hot spot in the pattern or portion of a pattern in a layout. A hot spot may be an issue with the layout configuration of an IC design, usability of an IC design or manufacturability of an IC design.

Preprocessed patterns in the library may have a transformation matrix and a validity range that have been computed prior to the performance of a search. During pattern matching with a preprocessed library, a determination may be made as to whether a pattern has a hot spot similar to a pattern in the preprocessed library by using the transformation matrix and the validity range associated with a pattern in the library. A given pattern represented by a pattern signature, such as a vector of numbers, may fall into a particular range, associated with a pattern in the library, after application of a metric on the numbers from the numbers of a pattern signature or pattern representation. If the pattern representation falls into a particular range after application of a metric, then the pattern representation may be transformed with the transformation matrix that is associated with a pattern in the library in order to calculate a score for the pattern. After a lithoscore has been computed, a determination may be made whether the calculated lithoscore indicates that there is a hot spot in the given pattern. In some embodiments, a transformation matrix may linearly transform a vector into a single number or score. The transformation matrix may be applied to a pattern signature, a vector of numbers that identify a pattern, for a given pattern.

A pattern signature is a representation for a pattern, such as a vector of numbers. Pattern signatures provide the ability to quickly identify or match similar patterns in IC designs by comparing of patterns and without the need to sort the vertices of the geometric objects or shapes in the patterns during the pattern matching process. Various matching metrics may be used with pattern signatures to get the closest or best possible match between patterns. Pattern signatures are described in co-pending application entitled "Intelligent Pattern Signature Based on Lithography Effects" filed on Dec. 7, 2007 with application Ser. No. 11/952,912 and co-pending application entitled "Pattern Signature" filed on Dec. 27, 2007 with application Ser. No. 11/965,680. During pattern matching, if a pattern signature of a given pattern has points or numbers that are close or similar to a pattern signature of a pattern in the library, then the points may be transformed with the transformation matrix to compute a score for the given pattern.

FIG. 1A is a flowchart for querying a preprocessed pattern library. Initially, a range is associated with a first pattern stored in the preprocessed pattern library (100). The range indicates a distance from a point in the representation for the first pattern that can be considered a close enough match to a point in the representation for a second pattern. If the distances between the points for the first pattern and the second pattern fall within the range for the first pattern, then the patterns are a close enough match to apply the transformation matrix associated with the first pattern. Embodiments may vary in the size of the range and may have a range of zero to force an exact match between the patterns.

Next, a representation for the first pattern may be determined (102) and a representation for the second pattern may be determined (104). As discussed above, a pattern may be represented with a pattern signature or vector of numbers for the pattern. A distance between the representation for the first pattern and the representation for the second pattern can be determined (106). For example, the Euclidean distance can been calculated to measure the difference between the points or numbers in a pattern signature w1, w2 for pattern W and pattern signature j1, j2 for pattern J with squareroot(($w1-j1)^2+(w2-j2)^2$). After the distance between the representation of the first pattern and the representation of the second pattern is calculated, a determination is made as to whether the distance falls within a range associated with the first pattern (108). If the distance is within the range associated with the first pattern (108), then the transformation matrix associated with the first pattern can be applied to the second pattern (110).

The transformation matrix associated with the first pattern may transform the second pattern or pattern representation into a score. The score provides information about the second pattern. For example, the score may be a lithoscore for the pattern that indicates the presence or probability of the presence of a hot spot.

Figure 1B:
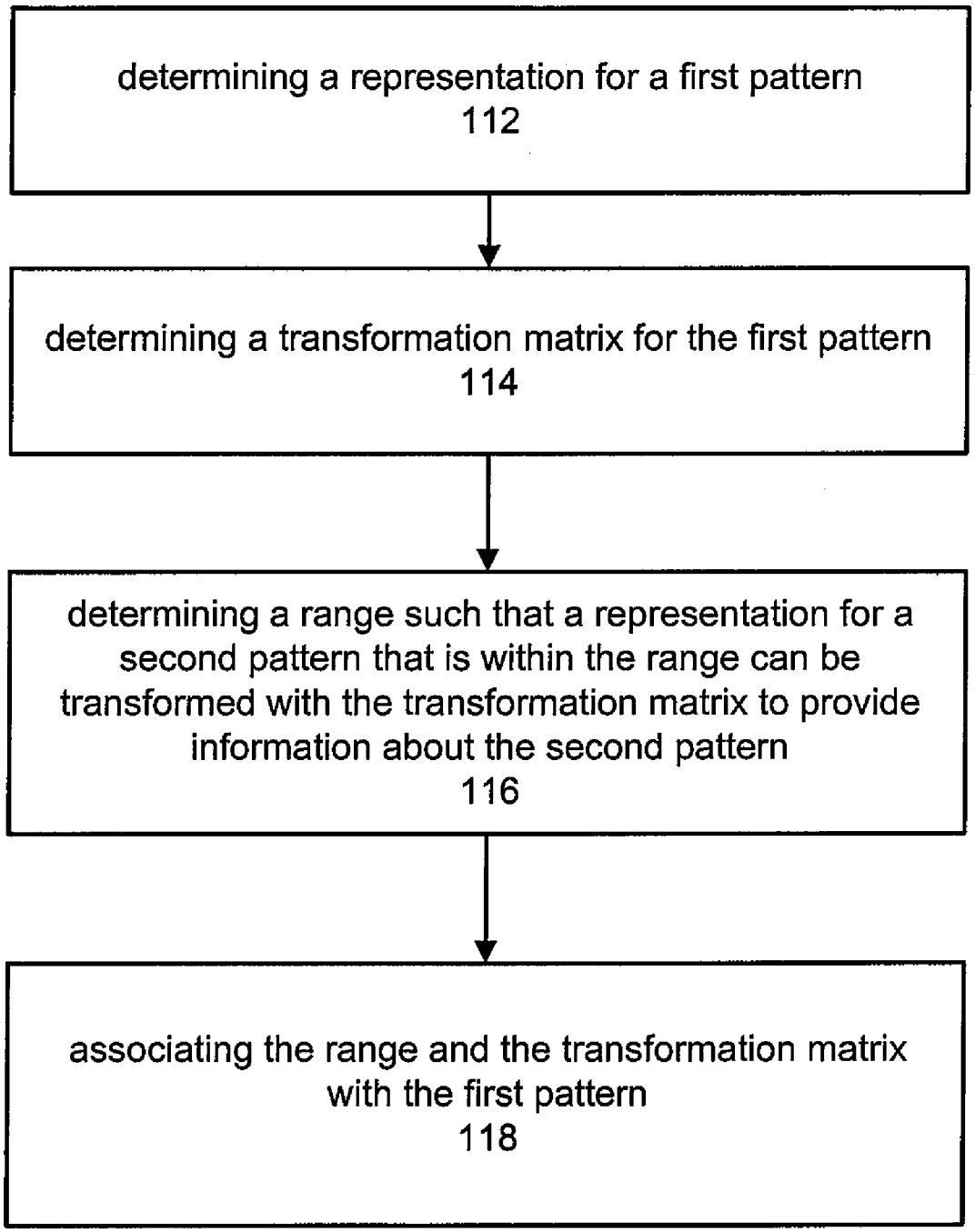
FIG. 1B is a flowchart for an approach for preprocessing of a pattern.

FIG. 1B is a flowchart for an approach for preprocessing of a pattern. Initially, a representation for a first pattern is determined (112). As discussed above, a pattern signature for the first pattern may represent the first pattern with a vector of numbers. Next, a transformation matrix is determined for the first pattern (114). Embodiments may determine a transformation matrix for a pattern using Jacobian sensitivity, solving a system of linear equations or localized linear regression. The transformation matrix may be approximated and refined with comparisons between the score obtained with a transformed pattern using the transformation matrix and a score obtained with a simulation for a pattern.

Continuing with FIG. 1B, a range may be determined for the first pattern (116). The distance between a first and second pattern that falls within the range allows the transformation of the second pattern to provide information about the second pattern. In one embodiment, a range may be determined by starting with a small range and slowly increasing the range until a linearity test fails, when the transformation matrix is no longer valid. A comparison between expected and actual results using selected points with the transformation matrix may determine the range acceptable for a pattern. After the range and the transformation matrix have been determined for the pattern, the range and the transformation matrix are associated with the first pattern (118).

Figure 2:
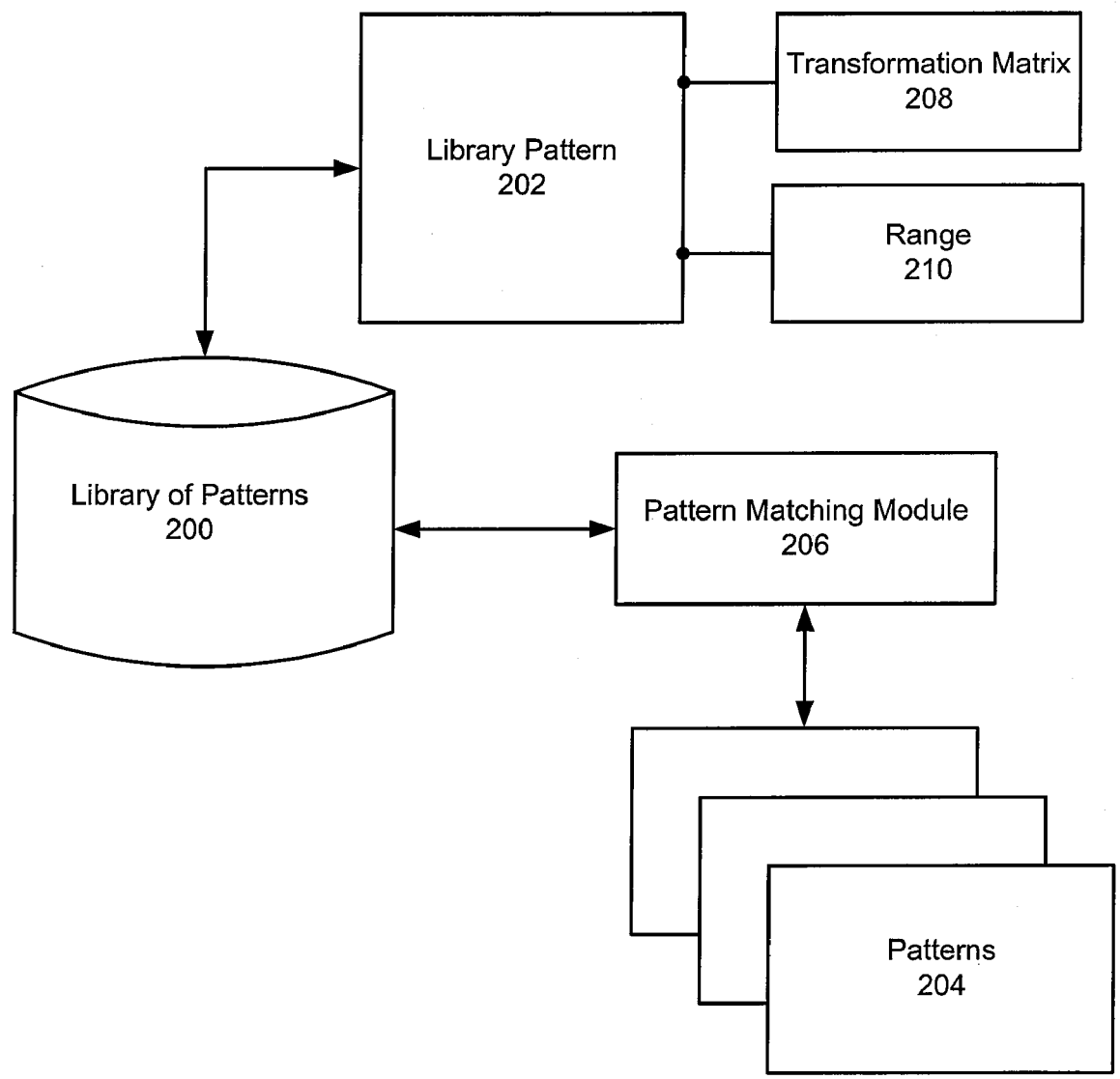
FIG. 2 illustrates an approach for a preprocessed library.

FIG. 2 illustrates an approach for implementing a preprocessed library. The preprocessed Library of Patterns 200 has Library Patterns 202 and a Library Pattern 202 can be used to identify any number of Patterns 204 during pattern matching. Embodiments may use a database for the Library of Patterns 200. The Library of Patterns 200 may store the association between a Library Pattern 202 and a Range 210 for the Library Pattern 202, and the association between a Library Pattern 202 and a Transformation Matrix 208.

A Pattern Matching Module 206 may use a Range 210 to determine whether a Pattern 204 matches a Library Pattern 202 and a Transformation Matrix 208 to determine if the pattern contains a similar hotspot as a Library Pattern 202 in the Library of Patterns 200. The Range 210 identifies a distance between two patterns that allows a pattern to be considered a match to a Library Pattern 202 associated with the Range 210, and the Pattern Matching Module 206 may compute the distance between two patterns and determine if a given pattern falls within the Range 210 of a Library Pattern 202. The use of a Range 210 allows for a greater number of similar patterns to be identified with a Library Pattern 202. The Transformation Matrix 208 provides information about a Pattern 204 that falls within the Range 210 for the Library Pattern 202. In one or more embodiments, the Transformation Matrix 208 calculates a score that indicates the severity or the friendliness of a particular spot in a layout for a given pattern.

Figure 3:
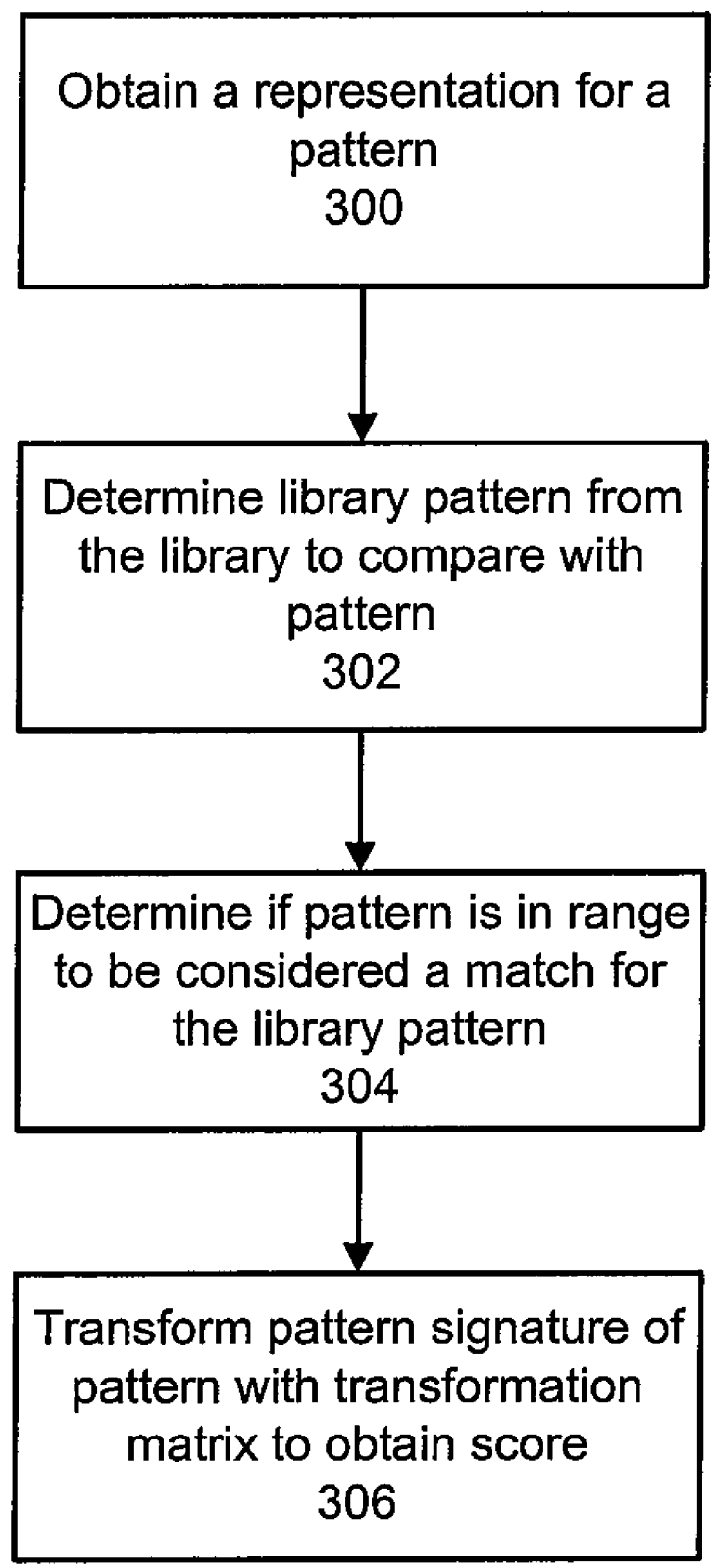
FIG. 3 shows a flowchart for pattern matching with a preprocessed library.

FIG. 3 shows a flowchart for pattern matching with a preprocessed library. Initially, a representation for a pattern is obtained (300) in order to compare the pattern with a representation of a Library Pattern 202 in a Library of Patterns 200. In one or more embodiments, a representation for a pattern is a pattern signature or vector of numbers. Next, it is determined which Library Pattern 202 from the Library of Patterns 200 should be compared with the pattern (302). Embodiments may compute a distance between the signature of a pattern and a Library Pattern 202 to determine if the Library Pattern 202 is appropriate for comparison with the pattern. For example, the Euclidean distance can been calculated to measure the difference between the pattern signature w1, w2 for pattern W and pattern signature j1, j2 for pattern J with squareroot($(w1-j1)^2+(w2-j2)^2$). If the distance between a pattern signature and a Library Pattern 202 signature is below a certain threshold, then the library pattern may be appropriate for comparison.

Continuing with FIG. 3, if the pattern is in the range to be considered a match with a pattern in the library or within a Range 210 that is determined to provide a high degree of accuracy (304), then the pattern is transformed with the Transformation Matrix 208 (306). The Transformation Matrix 208 may be applied to one or more numbers from the representation of the pattern or pattern signature. The transformed pattern provides a lithoscore that may indicate whether the pattern contains a hot spot. The library may contain lithoscores associated with the Library Pattern 202 that can be used as lookup table for hot spot detection.

Figure 4:
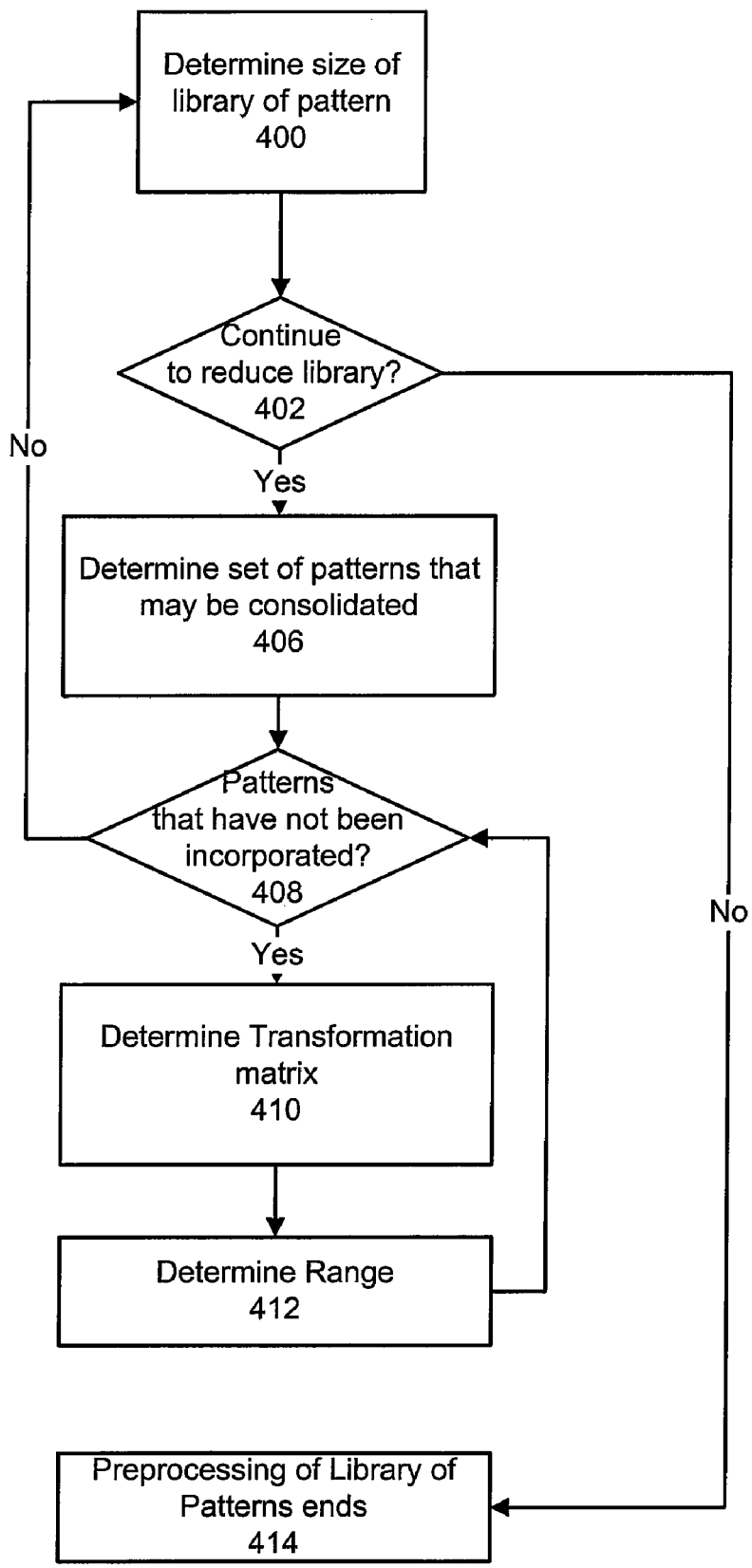
FIG. 4 is a flowchart for reducing the size of a library of patterns.

FIG. 4 is a flowchart for reducing the size of a library of patterns. Initially, the size of the current Library of Patterns 200 may be determined (400). Next, it must be determined if reduction of the Library of Patterns 200 is necessary (402). If the Library of Patterns 200 is sufficiently reduced, then the preprocessing of the patterns in the Library of Patterns 200 ends (414). Alternatively, if the Library of Patterns 200 should be reduced, then a set of patterns that may be consolidated and represented by a pattern in the Library of Patterns 200 (406). Embodiments may select an initial group of patterns that may be consolidated by determining a set of patterns that are close matches or meet a user defined threshold for a set of patterns that may be consolidated.

After the set of patterns that may be consolidated are determined, an attempt is made to consolidate each of the patterns in the set or a portion of the patterns identified in the set to be incorporated or represented by one pattern. In order to loop through the set of identified patterns, a determination is made for whether there are patterns in the set of patterns that have not been incorporated (408). If the patterns that are to be consolidated are incorporated and there are no more patterns to be incorporated (408), then the size of the Library of Patterns 200 is determined (400).

Alternatively, if there are patterns from the set that have not been incorporated (408), then a Transformation Matrix 208 for the patterns that were able to be incorporated or consolidated into being represented by one pattern in the Library of Patterns 200 is determined (410). Embodiments may have a sample size of patterns in the set to be incorporated or consolidated that allows for the use of interpolation to determine a Transformation Matrix 208 to represent the patterns in the set of patterns. In one or more embodiments, a Transformation Matrix 208 could be determined for the set of patterns using Jacobian sensitivity, solving a system of linear equations or using linear regression (410).

Next, a Range 210 is determined to indicate a radius from each of the points of a pattern representation that accuracy is guaranteed for the Transformation Matrix 208 for the pattern (412). The Range 210 may be as accurate or provide as much of a guarantee as desired by the user. For example, the user may require that the range be zero and limit pattern matching to exact matches with the patterns in the Library of Patterns 200. After a Range 210 has been determined, a decision must be made as to whether there are more patterns that need to be incorporated (408).

Figure 5:
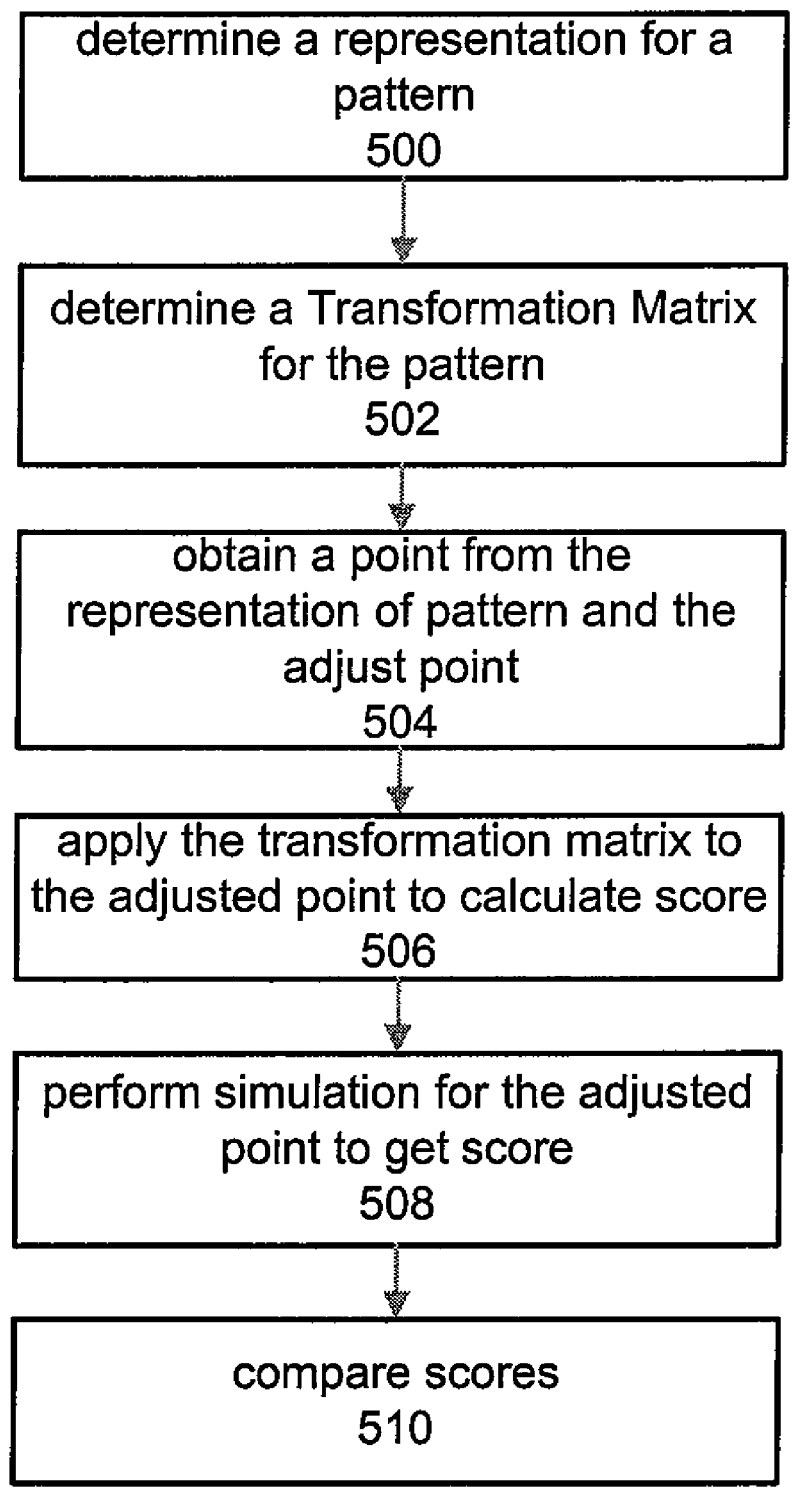
FIG. 5 is a flowchart for an approach to generating a transformation matrix for a pattern.

FIG. 5 is a flowchart for an approach to generating a transformation matrix for a pattern. Initially, a representation is determined for a pattern (500). The pattern signature may be calculated or generated to serve as a representation for a pattern. The pattern signature generated for the pattern may be a lossy transformation or incapable of converting the signature back into the vertices or points in the pattern used to generate the pattern signature. Next, a Transformation Matrix 208 is determined for the pattern (502). Embodiments may use a Jacobian sensitivity matrix for the Transformation Matrix 208 of the pattern. Mathematically embodiments may compute the score with the Transformation Matrix using the following equation $s'=s_p+A(p)(v'-v_p)$; where A(p), Transformation Matrix=$(ds'/dp')*(dp'/dv')$, $s'$ is the score of the query point, $s_p$ is the score of the nominal pattern, $(v'-v_p)$ is the difference between the signatures, $v'$ is a signature vector of the query point, and $v_p$ is the signature vector for the nominal pattern.

Next, a point may be obtained from the representation of the pattern and adjusted (504). The adjusted point may be a point from a second pattern that is similar to the first pattern in the Library of Patterns 200 such that identifying a Transformation Matrix for the first pattern would eliminate the need for both patterns in the Library of Patterns 200. A transformation matrix is then applied to adjusted point to calculate a score for the adjusted point (506). A simulation is performed using the adjusted point to get a score (508). The scores for the adjusted point from the transformation matrix computation and the simulation are compared (510) to determine if the Transformation Matrix 208 is acceptable for the adjusted point. If the Transformation Matrix 208 is acceptable for the adjusted point, then a corresponding pattern for the adjusted point can be removed from the library provided the points for the corresponding pattern are likewise are acceptable with the Transformation Matrix 208.

Figure 6:
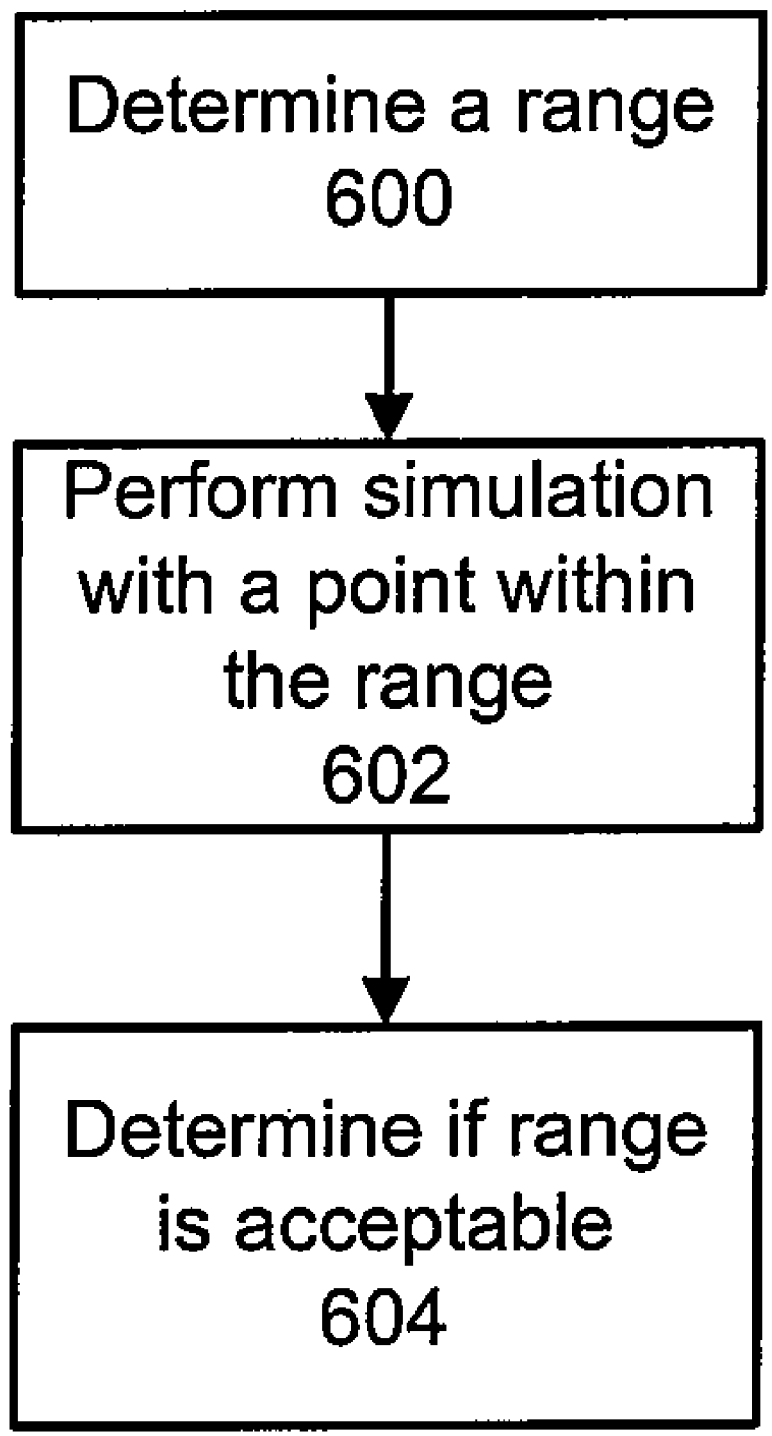
FIG. 6 is a flowchart for an approach to generating a range for a pattern.

FIG. 6 is a flowchart for an approach to generating a range for a pattern. Initially, a range is determined or approximated for a pattern (600). The range may be a radius or distance permitted from a point in the representation of the pattern, such as a pattern signature. Next, a simulation for the pattern is performed using a point within the range (602). A score may be obtained with the simulation for the pattern using the point. A determination must be made as to whether the range is correct or provides satisfactory results for the information obtained with the score (604). Embodiments may compare the score obtained with the simulation with a score obtained for the point within the range using the transformation matrix. If the scores are similar or as expected, then the range may be associated with the pattern in the library.

System Architecture Overview

In the following description, numerous details are set forth for purpose of explanation. However, one of ordinary skill in the art will realize that various embodiments of the invention may be practiced without the use of these specific details. In other instances, well-known structures and devices are shown in block diagram form in order not to obscure the description of various embodiments of the invention with unnecessary detail.

Figure 7:
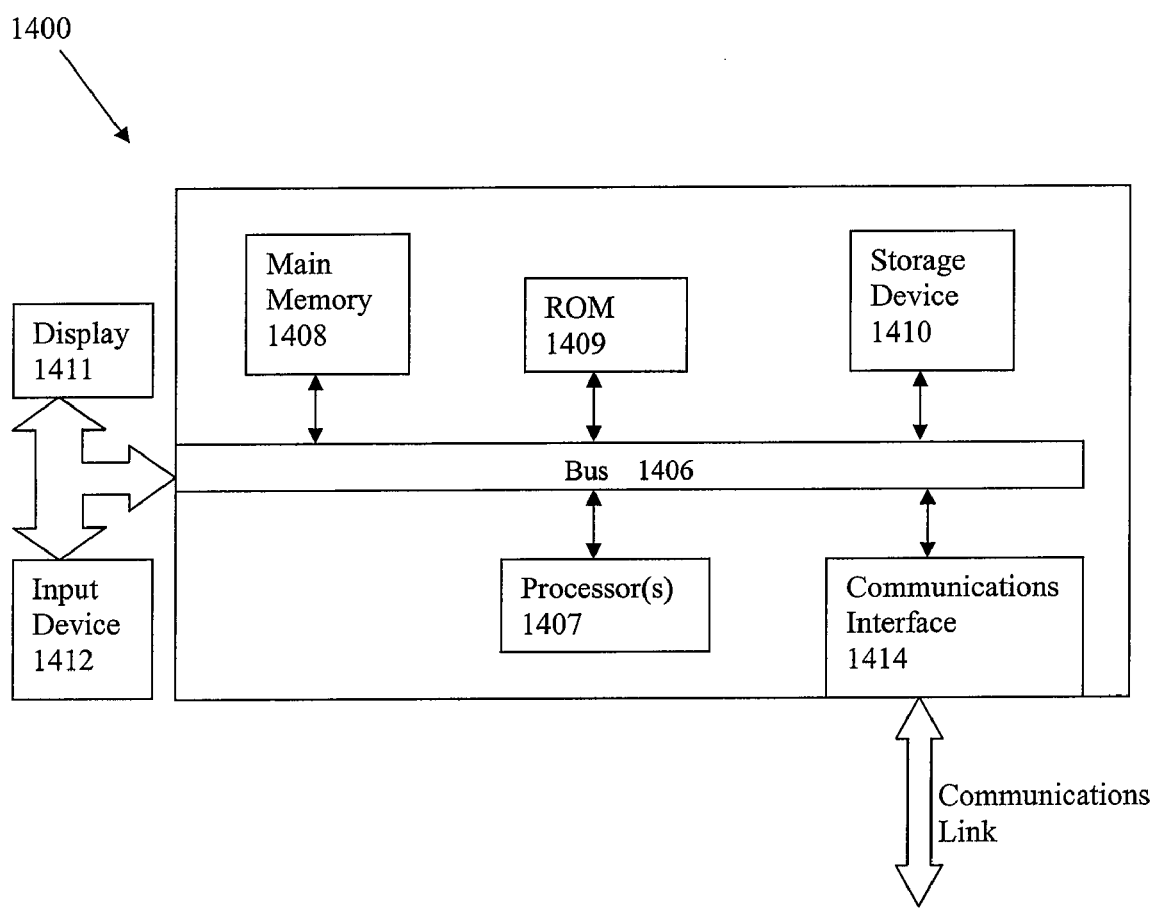
FIG. 7 is a block diagram of an architecture that can support implementation of an automatic test generator for a compiler.

FIG. 7 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A method for querying a preprocessed library of patterns, comprising:
    associating a range with a first pattern;
    determining a representation or signature for the first pattern;
    determining a representation or signature for a second pattern, wherein
        one of the representation or signature for the first pattern and the representation or signature for the second pattern is incapable of being converted back to geometric entities used to generate the representation or signature for the first pattern or for the second pattern;
    determining a distance between the representation or signature for the first pattern and the representation or signature for the second pattern;
    determining whether the distance between the representation or signature for the first pattern and the representation or signature for the second pattern is within the range for the first pattern;
    transforming, by using a processor, the representation or signature for the second pattern with a transformation matrix into a score to provide information about the second pattern, in which the information indicates whether the second pattern in a layout design contains a hotspot.

2. The method of claim 1, wherein the information provided about the second pattern is a lithoscore.

3. The method of claim 2, wherein the score represents a degree of severity or friendliness of a spot in a layout.

4. The method of claim 1, wherein the representation or signature for the first pattern is a pattern signature.

5. The method of claim 4, wherein the pattern signature is a vector.

6. The method of claim 1, wherein the distance is determined using a metric.

7. A method for preprocessing a pattern in a library of patterning, comprising:
    determining a representation or signature for a first pattern;
    determining a transformation matrix for the first pattern;
    determining a range for the first pattern, wherein
        a distance between the representation or signature for the first pattern and a representation or signature for a second pattern is within the range and the representation or signature for the second pattern can be transformed with the transformation matrix into a score to provide information about the second pattern,
        the information indicates whether the second pattern in a layout design contains a hotspot, and
        one of the representation or signature for the first pattern and the representation or signature for the second pattern is incapable of being converted back to geometric entities used to generate the representation or signature for the first pattern or for the second pattern; and
    associating, by using a processor, the range and the transformation matrix with the first pattern.

8. The method of claim 7, wherein the information about the second pattern is a lithoscore.

9. The method of claim 8, wherein the score represents a degree of severity or friendliness of a spot in a layout.

10. The method of claim 7, wherein the transformation matrix is determined with Jacobian sensitivity.

11. The method of claim 7, wherein the representation or signature for the first pattern is a pattern signature.

12. The method of claim 11, wherein the pattern signature is a vector.

13. A system for querying a preprocessed library of patterns, comprising:
a non-transitory computer readable medium that is at least to store an association between a range and a representation or signature for a first pattern, wherein
a distance is to be determined between the representation or signature for the first pattern and a representation or signature for a second pattern; and
a processor that is at least to determine whether the distance between the representation or signature for the first pattern and the representation or signature for the second pattern is within the range for the first pattern, wherein
the processor is further to transform the representation or signature for the second pattern that is within the range with a transformation matrix into a score to provides information about the second pattern,
the information indicates whether the second pattern in a layout design contains a hotspot, and
one of the representation or signature for the first pattern and the representation or signature for the second pattern is incapable of being converted back to geometric entities used to generate the representation or signature for the first pattern or for the second pattern.

14. The system of claim 13, wherein the information provided about the second pattern is a lithoscore.

15. The system of claim 14, wherein the score represents a degree of severity or friendliness of a spot in a layout.

16. The system of claim 13, wherein the representation or signature for the first pattern is a pattern signature.

17. The system of claim 16, wherein the pattern signature is a vector.

18. A system for preprocessing a pattern in a library of patterns, comprising:
a processor that is at least to:
determine a representation or signature for a first pattern,
determine a transformation matrix for the first pattern, and
determine a range for the first pattern, wherein
when a distance between the representation or signature for the first pattern and a representation or signature for a second pattern is within the range,
the representation or signature for the second pattern is transformed with the transformation matrix into a score to provide information about the second pattern,
the information indicates whether the second pattern in a layout design contains a hotspot, and
one of the representation or signature for the first pattern and the representation or signature for the second pattern is incapable of being converted back to geometric entities used to generate the representation or signature for the first pattern or for the second pattern;
a non-transitory computer readable medium for storing that is at least to store an association between the range and the first pattern and storing to store an association between the transformation matrix and the first pattern.

19. The system of claim 13, wherein the information provided about the second pattern is a lithoscore.

20. The system of claim 13, wherein the representation or signature for the first pattern is a pattern signature.

21. A computer program product comprising a non-transitory computer readable medium having instructions which, when executed by a processor, causes the processor to execute a process for querying a preprocessed library of patterns, the process comprising:
associating a range with a first pattern;
determining a representation or signature for the first pattern;
determining a representation or signature for a second pattern, wherein
one of the representation or signature for the first pattern and the representation or signature for the second pattern is incapable of being converted back to geometric entities used to generate the representation or signature for the first pattern or for the second pattern;
determining a distance between the representation or signature for the first pattern and the representation or signature for the second pattern;
determining whether the distance between the representation or signature for the first pattern and the representation or signature for the second pattern is within the range for the first pattern; and
transforming the representation or signature for the second pattern with a transformation matrix into a score to provide information about the second pattern, in which the information indicates whether the second pattern in a layout design contains a hotspot.

22. The computer program product of claim 21, in which the information provided about the second pattern is a lithoscore.

23. The computer program product of claim 21, wherein the representation or signature for the first pattern is a pattern signature.

24. A computer program product comprising a non-transitory computer readable medium having instructions which, when executed by a processor, causes the processor to execute a process for preprocessing a pattern in a library of patterns, the process comprising:
determining a representation or signature for a first pattern;
determining a transformation matrix for the first pattern;
determining a range for the first pattern, wherein
when a distance between the representation or signature for the first pattern and a representation or signature for a second pattern is within the range and the representation or signature for the second pattern is transformed with the transformation matrix into a score to provide information about the second pattern,
the information indicates whether the second pattern in a layout design contains a hotspot, and
one of the representation or signature for the first pattern and the representation or signature for the second pattern is incapable of being converted back to geometric entities used to generate the representation or signature for the first pattern or for the second pattern; and
associating the range and the transformation matrix with the first pattern.

25. The computer program product of claim 24, in which the information provided about the second pattern is a lithoscore.

26. The computer program product of claim 24, wherein the representation or signature for the first pattern is a pattern signature.

* * * * *